United States Patent
Hayashi et al.

[11] Patent Number: 5,993,683
[45] Date of Patent: *Nov. 30, 1999

[54] PIEZOELECTRIC CERAMIC

[75] Inventors: Kohichi Hayashi, Shiga-ken; Akira Ando, Ohmihachiman; Akira Nagai, Tsuzuki-gun; Hiroshi Takagi, Otsu; Kiyoshi Hase, Ishikawa-ken, all of Japan

[73] Assignee: Murata Manufacturing Co., Ltd., Japan

[ * ] Notice: This patent is subject to a terminal disclaimer.

[21] Appl. No.: 08/746,242

[22] Filed: Nov. 7, 1996

[30] Foreign Application Priority Data

Nov. 8, 1995 [JP] Japan ................................ 7-289827

[51] Int. Cl.$^6$ .............................................. H01L 41/18
[52] U.S. Cl. .................... 252/62.9 PZ; 501/134
[58] Field of Search ...................... 252/62.9 PZ; 501/134

[56] References Cited

U.S. PATENT DOCUMENTS

| 4,985,381 | 1/1991 | Mori et al. | 501/134 |
| 5,403,788 | 4/1995 | Nishida et al. | 501/134 |

FOREIGN PATENT DOCUMENTS 575966 12/1993 European Pat. Off. .

*Primary Examiner*—C. Melissa Koslow
*Attorney, Agent, or Firm*—Ostrolenk, Faber, Gerb & Soffen, LLP

[57] ABSTRACT

The present invention provides a piezoelectric ceramic having a low mechanical quality coefficient Qm and excellent heat resistance, for example, a piezoelectric ceramic for a filter element which can be applied to surface mounting. The piezoelectric ceramic contains at least a composite oxide of lead, zirconium and titanium, and oxides of manganese, silicon and boron, the concentration of the manganese oxide present in the crystal gain boundary being higher than that in crystal grains of the piezoelectric ceramic.

12 Claims, 2 Drawing Sheets

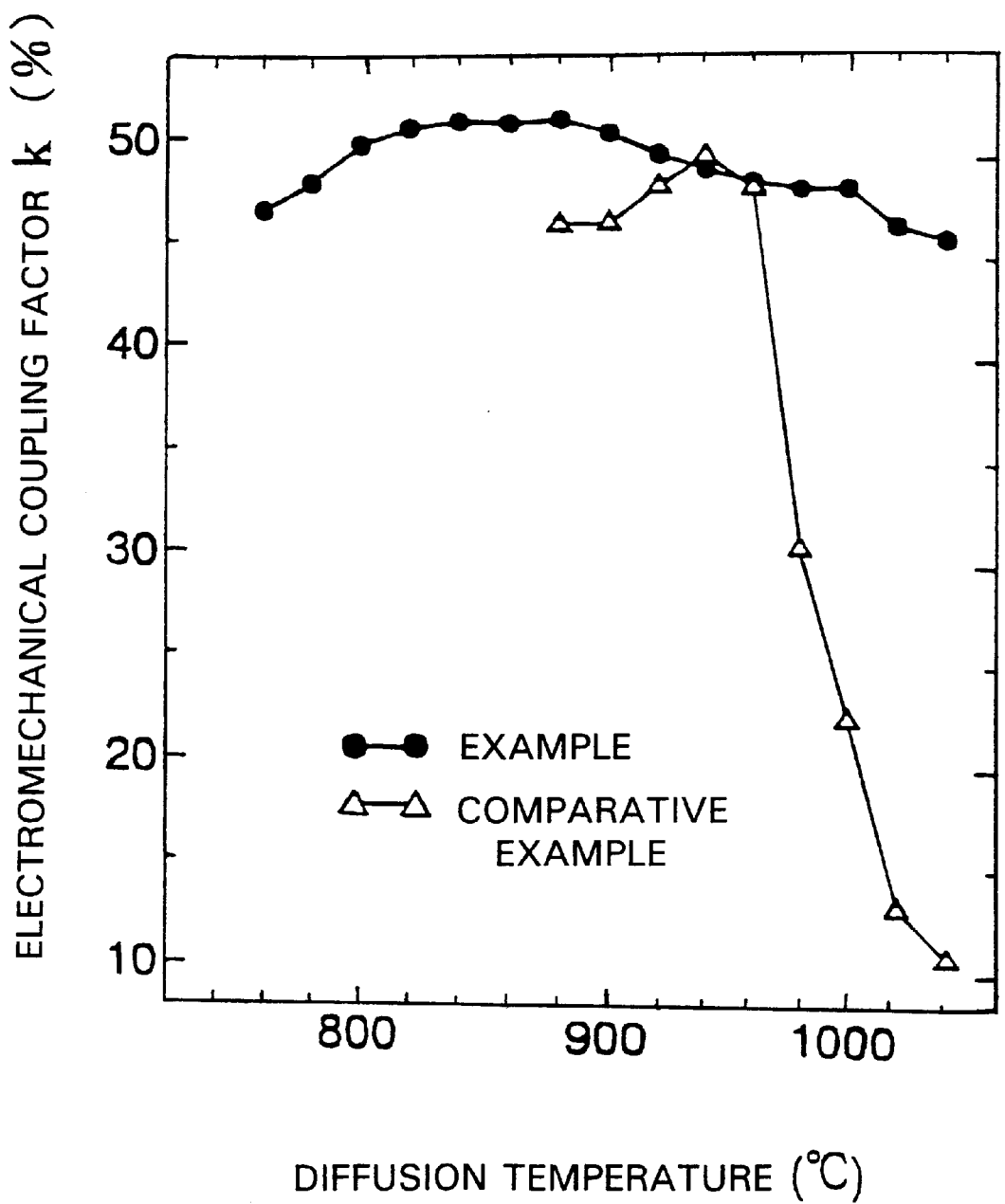

PIEZOELECTRIC CERAMIC

BACKGROUND OF THE INVENTION

1. Field of the Invention

The present invention relates to a piezoelectric ceramic and more particularly, to a piezoelectric ceramic used for a surface mounting type piezoelectric part required to have heat resistance.

2. Description of the Related Art

A piezoelectric ceramic comprising lead titanate zirconate ($Pb(Ti_xZr_{1-x})O_3$) or the like as a main component is widely used conventionally as the piezoelectric ceramic for an electronic device such as a ceramic filter, etc., and attempts have been made to add small amounts of various additives for improving the piezoelectric characteristics thereof.

More particularly, a material for a ceramic filter having excellent properties such as a flat group delay time (GDT) and a small phase distortion is required to have a low mechanical quality coefficient Qm. Known examples of such a material include a material comprising lead titanate zirconate containing niobium oxide, antimony oxide, tantalum oxide or the like as an additive, and a material comprising lead titanate zirconate in which Pb atoms are partly displaced by a rare earth element such as Sc, Ba, Ca, La or the like.

Although such a low Qm value piezoelectric ceramic causes no problem when the electrodes formed at both ends thereof are short-circuited, the piezoelectric ceramic has the problem that even if it has a high Curie temperature, the electromechanical coupling factor K decreases as the temperature rises when the electrodes are open, thereby significantly shifting the resonance and antiresonance frequencies. Therefore, when the piezoelectric ceramic is used for a surface-mounting type filter element, there is the problem that filter characteristics significantly deteriorate as the ceramic is heated to a high temperature (above about 250° C.) during reflow soldering.

A method for solving the above problem has been reported in which a manganese compound is thermally diffused from a surface of the piezoelectric ceramic having a low Qm value and a high Curie temperature so that a high concentration of manganese oxide is distributed in a crystal grain boundary layer, thereby decreasing the resistivity of the crystal grain boundary portion and improving the heat resistance of the ceramic (Japanese Patent Unexamined Publication Nos. 6-1655 to 6-1657).

However, this method has a problem with respect to the production process in that if the structure of the crystal grain boundary of the piezoelectric ceramic which was previously sintered is changed or if the Pb amount of the piezoelectric ceramic is changed due to evaporation during the production process or if the inside of a thermal diffusion furnace has a wide temperature distribution, variations in the characteristics are increased when the manganese compound is thermally diffused from the surface of the piezoelectric ceramic. It is thus difficult to perform stable thermal diffusion of a large amount of manganese compound, and it is impossible to sufficiently decrease the resistivity of the crystal grain boundary portion and improve the heat resistance.

SUMMARY OF THE INVENTION

Accordingly, an object of the present invention is solve the above problem and provide a piezoelectric ceramic having a low mechanical quality coefficient Qm and excellent heat resistance, for example, a piezoelectric ceramic for a filter element which can be applied to surface mounting.

In accordance with the present invention, there is provided a piezoelectric ceramic comprising at least a composite oxide of lead, zirconium and titanium, and oxides of manganese, silicon and boron.

In the present invention, the piezoelectric ceramic contains about 0.005 to 0.3 wt % of manganese oxide in terms of $MnO_2$, about 0.3 wt % or less (except 0 wt %) of silicon oxide in terms of $SiO_2$, and about 0.02 wt % or less (except 0 wt %) of boron oxide in terms of $B_2O_3$.

In the piezoelectric ceramic, the concentration of the manganese oxide present in the crystal grain boundary layer is more than that in the crystal grains.

Since the piezoelectric ceramic comprises oxides of manganese, silicon and boron, and the concentration of the manganese oxide present in the crystal grain boundary layer is higher than that in the crystal grains, it is possible to uniformly distribute the manganese oxide in the crystal grain boundary layer, thereby decreasing the resistivity of the piezoelectric ceramic and improving the heat resistance thereof.

BRIEF DESCRIPTION OF THE DRAWINGS

FIG. 2 is a graph showing changes in electromechanical coupling factor K with the diffusion temperature.

DESCRIPTION OF THE PREFERRED EMBODIMENTS OF THE INVENTION

Figure 1:
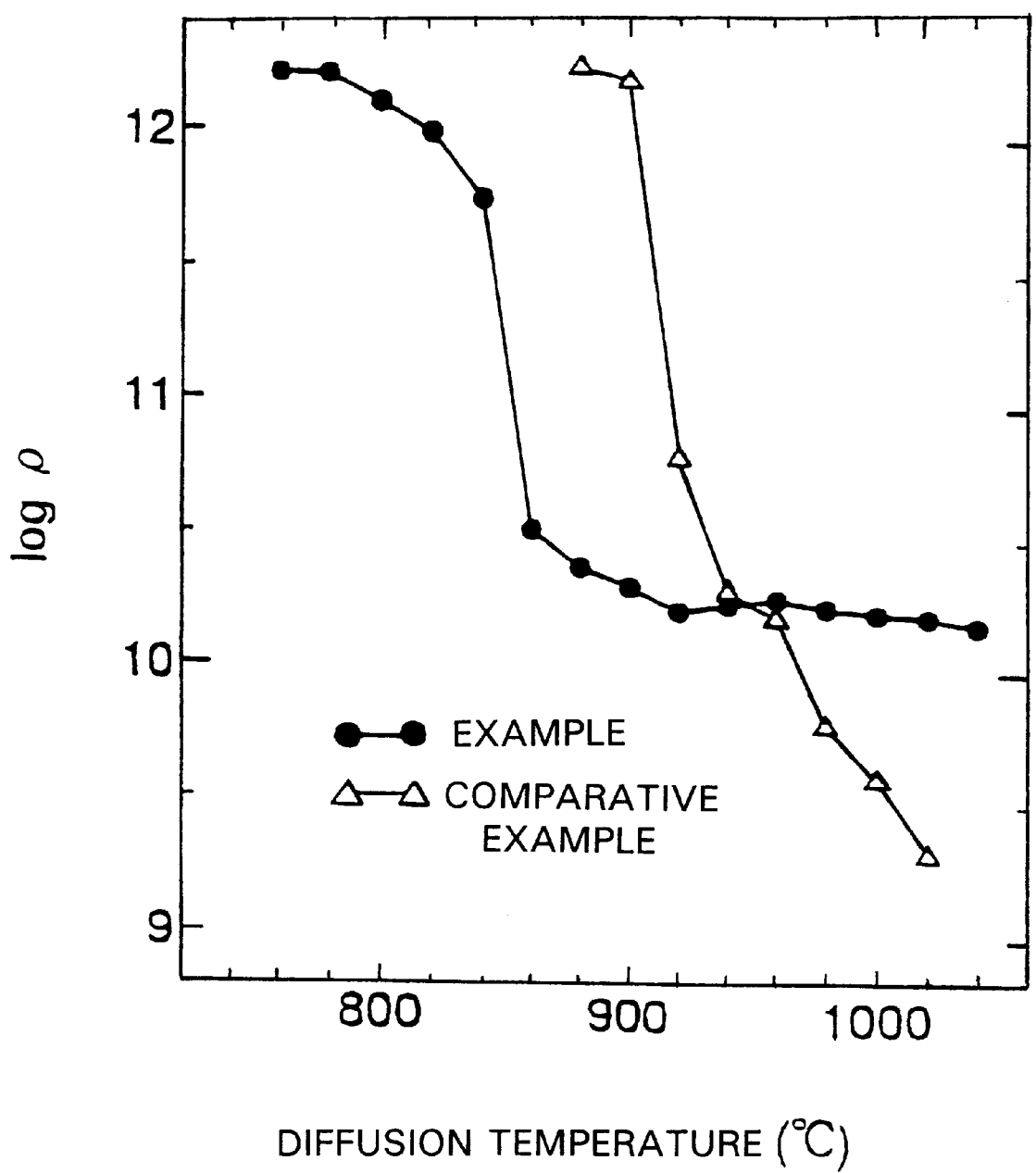
FIG. 1 is a graph showing changes in resistivity ρ with the diffusion temperature.

The present invention is described in further detail below with reference to examples.

EXAMPLE 1

$SiO_2$ and $B_2O_3$ were added to raw materials of a piezoelectric ceramic during preparation of the raw materials so as to be contained in the piezoelectric ceramic. A manganese compound was adhered to a surface of the piezoelectric ceramic, followed by heat treatment for diffusing the adhered compound into a crystal grain boundary portion of the piezoelectric ceramic.

Namely, powders of PbO, SrO, $La_2O_3$, $TiO_2$ and $ZrO_2$ as component materials of a piezoelectric ceramic having a low mechanical quality coefficient Qm, and powders of $SiO_2$ and $B_2O_3$ as additives were prepared. These powders were weighed to obtain a ceramic having a composition comprising ($Pb_{0.95}Sr_{0.03}La_{0.02}$) ($Zr_{0.51}Ti_{0.49}$) $O_3$ as a main component, and $SiO_2$ and $B_2O_3$ at each of the component ratios shown in Table 1. Water was added to the powders, and then mixed and ground by using a ball mill.

After the resultant mixture was dried, the mixture was pre-burned at 800 to 900° C. for 2 hours, small amounts of polyvinyl alcohol and water were added as a binder to the pre-burned material, followed by press molding under a pressure of 1000 kg/cm². The thus-obtained molded product was burned at 1100 to 1250° C. for 2 hours to obtain a rectangular plate-shaped ceramic having a size of 20×30 mm and a thickness of 1 mm.

On the other hand, in order to distribute a high concentration of manganese compound in the crystal grain boundary layer of the piezoelectric ceramic by thermal diffusion, $MnCO_3$ was selected as the manganese compound, and kneaded with varnish to produce a thermal diffusion paste.

The thus-produced thermal diffusion paste was then coated on both surfaces of the ceramic by screen printing, dried and heat-treated at a temperature of 750 to 1100° C. for 2 hours to diffuse the manganese compound. The ceramic was then ground to a thickness of 0.3 to 0.8 mm.

The contents of the manganese, silicon and boron oxides contained in the resultant ceramic were measured by IPC spectroscopic analysis and converted to contents in terms of $MnO_2$, $SiO_2$ and $B_2O_3$, respectively. In order to evaluate electric characteristics, silver electrodes were coated on both end surfaces of the ceramic, burned and then polarized in insulating oil (temperature: room temperature to 100° C.) for 30 minutes under application of an electric field of 2 to 3 kV/mm, to obtain a piezoelectric ceramic.

The thus-obtained piezoelectric ceramic was cut into a square plate of 5×5 mm, and the resistivity ρ and electromechanical coupling factor K in spreading vibration were measured.

In order to evaluate the heat resistance, the 5×5 mm square plate-shaped sample was heat-treated by being placed in a constant temperature bath at 250° C. for 3 minutes and then removed from the bath with the electrodes open. After the sample was allowed to stand at room temperature for 1 hour, the change (ΔFr) in resonance frequency (Fr) and the change (ΔFa) in antiresonance frequency (Fa) were measured.

The results of the measurement are shown in Table 1. In the table, samples shown with a mark * are outside the range of the invention.

The thus-formed thermal diffusion paste was then coated on both surfaces of the ceramic by screen printing, and heat-treated for 2 hours at the same temperature as Example 1 to diffuse the lead borosilicate glass and the manganese compound. A piezoelectric ceramic was obtained by the same method as Example 1, and then cut into a square 5×5 mm plate. The resistivity ρ and electromechanical coupling factor K in spreading vibration were measured.

On the basis of the results of measurement, FIG. 1 shows changes in the resistivity ρ with the diffusion temperature, and FIG. 2 shows changes in the electromechanical coupling factor k with the diffusion temperature.

Comparative Example

For comparison, a ceramic was produced without addition of $SiO_2$ and $B_2O_3$ during preparation of raw materials, and only $MnCO_3$ in the thermal diffusion paste was adhered to surfaces of the ceramic, and then heat-treated to produce a piezoelectric ceramic in which the adhered compound was diffused into the crystal grain boundary portion.

Namely, a ceramic having the same main component composition as the sample of Example 1 was produced by the same method as Example 1 except that $SiO_2$ and $B_2O_3$ were not added.

On the other hand, only $MnCO_3$ was kneaded with varnish to prepare the thermal diffusion paste, as in Example 1. The thermal diffusion paste was then adhered to both

TABLE 1

| Sample No. | Diffusion Temperature (C.) | $MnO_2$ (wt %) | $SiO_2$ (wt %) | $B_2O_3$ (wt %) | ρ (Ω · cm) | K (%) | ΔFr (kHz) | ΔFa (kHz) |
|---|---|---|---|---|---|---|---|---|
| *1 | — | 0.000 | 0.020 | 0.000 | $2.1 \times 10^{12}$ | 48.5 | 3.44 | −5.46 |
| *2 | — | 0.000 | 0.018 | 0.023 | $2.2 \times 10^{12}$ | 48.4 | 3.52 | −6.22 |
| *3 | 960 | 0.043 | 0.038 | 0.000 | $4.6 \times 10^{10}$ | 48.2 | 0.34 | −0.86 |
| *4 | 1000 | 0.127 | 0.069 | 0.000 | $3.1 \times 10^{9}$ | 34.2 | 0.32 | −0.74 |
| *5 | 790 | 0.005 | 0.030 | 0.027 | $4.9 \times 10^{10}$ | 49.8 | 0.42 | −0.82 |
| *6 | 840 | 0.027 | 0.038 | 0.039 | $4.8 \times 10^{10}$ | 51.2 | 0.28 | −0.75 |
| 7 | 840 | 0.032 | 0.029 | 0.088 | $3.9 \times 10^{10}$ | 48.4 | 0.58 | −0.92 |
| 8 | 960 | 0.097 | 0.061 | 0.066 | $4.7 \times 10^{10}$ | 50.4 | 0.66 | −0.84 |
| 9 | 1000 | 0.123 | 0.084 | 0.070 | $4.1 \times 10^{10}$ | 49.2 | 0.42 | −0.68 |
| 10 | 1000 | 0.189 | 0.120 | 0.085 | $3.7 \times 10^{10}$ | 48.2 | 0.38 | −0.55 |
| 11 | 1000 | 0.222 | 0.250 | 0.102 | $2.2 \times 10^{10}$ | 48.1 | 0.39 | −0.62 |
| 12 | 1020 | 0.295 | 0.085 | 0.082 | $2.1 \times 10^{10}$ | 48.2 | 0.38 | −0.54 |
| 13 | 860 | 0.042 | 0.298 | 0.038 | $4.2 \times 10^{10}$ | 47.5 | 0.28 | −0.44 |
| 14 | 860 | 0.041 | 0.041 | 0.192 | $3.5 \times 10^{10}$ | 46.9 | 0.22 | −0.46 |
| *15 | 860 | 0.039 | 0.048 | 0.210 | $3.3 \times 10^{10}$ | 40.2 | 0.32 | −0.40 |
| 16 | 1050 | 0.320 | 0.279 | 0.154 | $8.2 \times 10^{9}$ | 38.1 | 0.67 | −0.94 |
| *17 | 1050 | 0.222 | 0.308 | 0.102 | $9.8 \times 10^{9}$ | 24.3 | 0.44 | −0.54 |

EXAMPLE 2

Although in Example 1, $SiO_2$ and $B_2O_3$ were added during preparation of raw materials of a piezoelectric ceramic so as to be contained in the piezoelectric ceramic, $SiO_2$ and $B_2O_3$ can be present in the ceramic by thermal diffusion in the same manner as the manganese oxide. This example is an illustration.

Namely, a piezoelectric ceramic having the same main component composition as the sample of Example 1 was produced by the same method as Example 1 except that $SiO_2$ and $B_2O_3$ were not added during preparation of the raw materials.

On the other hand, lead borosilicate glass (as a source of Si and B) and $MnCO_3$ were mixed at a ratio by weight of 5:5, and then kneaded with varnish to form a thermal diffusion paste.

surfaces of the ceramic by screen printing, and heat-treated for 2 hours at the same temperature as Example 1 to diffuse the manganese compound. A piezoelectric ceramic was obtained by the same method as Example 1, and then cut into a square 5×5 mm plate. The resistivity ρ and electromechanical coupling factor K in spreading vibration were measured. On the basis of the results of measurement, FIG. 1 shows changes in the resistivity ρ with the diffusion temperature, and FIG. 2 shows changes in the electromechanical coupling factor k with the diffusion temperature.

FIG. 1 reveals that the piezoelectric ceramic in which the manganese compound and the lead borosilicate glass containing Si and B were thermally diffused causes a decrease in resistivity ρ at a low thermal diffusion temperature compared with the comparative example in which only the manganese compound was thermally diffused. Also, the comparative example shows an excessive decrease in the resistivity ρ at higher temperatures. Therefore, no polarization electric field can be applied, and thus the electromechanical coupling factor K rapidly decreases, as shown in FIG. 2.

FIG. 1 also indicates that the resistivity ρ of the piezoelectric ceramic of Example 2 subjected to thermal diffusion varies less with changes in the thermal diffusion temperature compared with the Comparative Example. Therefore, when a large amount of ceramic is subjected to thermal diffusion, the ceramic of Example 2 is hardly effected by the temperature distribution in the thermal diffusion furnace and the state of the crystal grains of the ceramic composition.

FIG. 2 indicates that, even if the thermal diffusion temperature changes, the electromechanical coupling factor K of the piezoelectric ceramic of Example 2 subjected to thermal diffusion has a high value over a wide temperature range compared with the Comparative Example. Although not shown in the figures, even in the case wherein $SiO_2$ and $B_2O_3$ were added during preparation of raw materials so as to be contained in the piezoelectric ceramic and a manganese compound was then adhered to the surfaces of the piezoelectric ceramic and heat-treated to diffuse the adhered compound into the crystal grain boundary portion (for example, as in Example 1), changes in the resistivity and electromechanical coupling factor with the diffusion temperature have the same tendency as Example 2.

Table 1 indicates that both changes in the resonance frequency and antiresonance frequency (ΔFr and ΔFa) are stable and small within the range of the present invention, and thus the piezoelectric ceramic of the present invention is excellent in heat resistance.

As described above, the piezoelectric ceramic the present invention comprises at least a composite oxide of lead, zirconium and titanium, and predetermined amounts of manganese, silicon and boron oxides, wherein the concentration of the manganese oxide present in the crystal grain boundary layer is higher than that in the crystal grains of the piezoelectric ceramic, thereby obtaining characteristics required for a piezoelectric material, i.e., low resistivity ρ and a high electromechanical coupling factor K. When the manganese compound is thermally diffused into the piezoelectric ceramic, a large amount of compound can be stably diffused without being effected by the grain structure changes in the components of the piezoelectric ceramic or the temperature distribution in the thermal diffusion furnace.

Description will now be made of reasons for setting preferable ranges of the contents of manganese, silicon and boron oxides in the piezoelectric ceramic of the present invention.

As shown by Sample Nos. 1 and 2 in Table 1, with less than about 0.005 wt % of $MnO_2$, the additive has no effect on the resistivity, etc. As shown by Sample No. 6, with over about 0.32 wt % of $MnO_2$, the resistivity is significantly decreased. Therefore, the $MnO_2$ content is preferably about 0.005 to 0.32 wt %. More preferably, the amount is about 0.027–0.295 wt %.

Since $SiO_2$ is contained as an impurity in the raw materials, the $SiO_2$ content cannot be easily decreased to zero in view of the cost of industrial production, but $SiO_2$ must be present in order to form a glass phase in the crystal grain boundary layer. However, as shown by Sample No. 17, with over about 0.3 wt % of $SiO_2$, the electromechanical coupling factor K is significantly decreased. Therefore, the $SiO_2$ content is preferably about 0.3 wt % or less (excluding 0 wt %). More preferably, the amount is about 0.03–0.279 wt %.

If $B_2O_3$ is not present (i.e., is lower than the detection limit of ICP spectroscopic analysis), the optimum temperature range of thermal diffusion for thermally diffusing Mn ions into a ceramic becomes very narrow, thereby deteriorating the yield of industrial mass product at low cost. As shown by Sample No. 15, with over about 0.2 wt % of $B_2O_3$, the electromechanical coupling factor K is significantly decreased. The $B_2O_3$ content is thus preferably about 0.2 wt % or less (excluding 0 wt %). More preferably, the amount is about 0.038–0.192 wt %.

Although in the above examples, screen printing was used as the coating method for adhering the thermal diffusion paste to the ceramic surfaces, the coating method is not limited to this, and adhering methods such as brushing, spraying, etc. may be used.

Although the piezoelectric ceramic having a main component composition of $(Pb_{0.95}Sr_{0.03}La_{0.02})(Zr_{0.51}Ti_{0.49})O_3$ was used in the above examples, the piezoelectric ceramic is not limited to this, and two-component and three-component PZT ceramics having other compositions, and these materials in which lead is partly replaced by Sr, Ba, Ca, La or the like may be used.

Although the thermal diffusion paste containing a manganese compound and lead borosilicate at a ratio by weight of 5:5 was used, the ratio by weight of both components is not limited to this, and may be set to any desired value consistent with the amounts of metals described above.

As illustrated above, the source of the Si and B can be varied widely as long as the respective oxides in the desired amounts are formed by the end of the production process. In like manner, the source of the Mn can be varied widely as long as the oxide in the desired amount is present in the crystal grain boundary layer at a higher concentration than that in crystal grains of the piezoelectric ceramic by the end of the production process.

As described above, the present invention is capable of decreasing the resistivity of a PZT piezoelectric ceramic and improving the heat resistance thereof.

The present invention enables the low-cost mass production of a piezoelectric ceramic having a low mechanical quality coefficient Qm, a large electromechanical coupling factor K and low resistivity, and thus having excellent heat resistance, for example, a piezoelectric ceramic for a filter element which can be applied to surface mounting.

What is claimed is:

1. A piezoelectric ceramic comprising a composite oxide of lead, zirconium and titanium, and oxides of manganese, silicon and boron, wherein the concentration of manganese oxide present in the crystal grain boundary layer is higher than that in crystal grains of the piezoelectric ceramic and wherein the amount of manganese oxide in the ceramic is about 0.005 to 0.32 wt %, in terms of $MnO_2$.

2. A piezoelectric ceramic according to claim 1, comprising about 0.005 to 0.3 wt % of manganese oxide in terms of $MnO_2$, more than 0% and up to about 0.3 wt % of silicon oxide measured as $SiO_2$, and more than 0% and up to about 0.2 wt % of boron oxide measured as $B_2O_3$.

3. A piezoelectric ceramic according to claim 2, comprising about 0.027 to 0.295 wt % of manganese oxide in terms of $MnO_2$, about 0.03 to 0.279 wt % of silicon oxide measured as $SiO_2$, and about 0.038 to 0.192 wt % of boron oxide measured as $B_2O_3$.

4. In an electronic device containing a piezoelectric ceramic, the improvement which comprises said piezoelectric ceramic being the piezoelectric ceramic according to claim 1.

5. In an electronic device containing a piezoelectric ceramic, the improvement which comprises said piezoelectric ceramic being the piezoelectric ceramic according to claim 2.

6. In an electronic device containing a piezoelectric ceramic, the improvement which comprises said piezoelectric ceramic being the piezoelectric ceramic according to claim 3.

7. A process for producing a piezoelectric ceramic comprising providing raw materials to form a composite oxide of lead, zirconium and titanium and providing raw materials for silicon oxide and boron oxide; forming the composite oxide of lead, zirconium and titanium from the raw materials; applying a raw material to form an oxide of manganese to the mixture; heating the mixture having the applied raw material to form an oxide of manganese to produce a ceramic comprising the composite oxide of lead, zirconium and titanium, silicon oxide, boron oxide and manganese oxide; and polarizing the ceramic thus formed.

8. The process of claim 7 in which said the raw material to form the oxide of manganese is manganese carbonate.

9. The process of claim 7, where the mixture of the composite oxide with raw materials for silicon oxide and boron oxide are heated to form a ceramic of the composite oxide of lead, zirconium and titanium, silicon oxide and boron oxide.

10. A process for forming a piezoelectric ceramic comprising providing raw materials to form a composite oxide of lead, zirconium and titanium; forming the composite oxide of lead, zirconium and titanium from the raw materials; applying a mixture of a raw materials to form an oxide of manganese, an oxide of silicon and an oxide of boron oxide to the composite oxide; heating the mixture having the applied raw material to form an oxide of manganese to produce a ceramic comprising the composite oxide of lead, zirconium and titanium, silicon oxide, boron oxide and manganese oxide; and polarizing the ceramic thus formed.

11. The process of claim 10 in which said the raw material to form the oxide of manganese is manganese carbonate and the raw material to provide the oxides of silicon and boron is a borosilicate glass.

12. The process of claim 10, where the composite oxide are heated to form a ceramic.

* * * * *